United States Patent [19]

Fedan

[11] Patent Number: 5,028,889
[45] Date of Patent: Jul. 2, 1991

[54] OSCILLATOR HAVING A LIMITER COMPOSED OF A SYMMETRIC ACTIVE CLAMP

[76] Inventor: Orest Fedan, 15 Underwood St., Belmont, Mass. 02178

[21] Appl. No.: 398,743

[22] Filed: Aug. 25, 1989

[51] Int. Cl.⁵ .......................... H03B 5/00; H03L 5/00
[52] U.S. Cl. ..................................... 331/183; 307/547
[58] Field of Search ............. 331/109, 116 R, 116 FE, 331/117 R, 117 FE, 158, 167, 183

[56] References Cited

U.S. PATENT DOCUMENTS

| | | | |
|---|---|---|---|
| 3,137,826 | 6/1964 | Boudrias | 331/109 X |
| 3,460,056 | 8/1969 | Berger | 331/183 X |
| 4,797,639 | 1/1989 | Driscoll | 331/77 X |

Primary Examiner—Siegfried H. Grimm
Attorney, Agent, or Firm—Paul G. Lunn

[57] ABSTRACT

Disclosed is an oscillator circuit comprised of a sharp bandpass filter having an input and an output; a linear gain stage having an input and an output, the output of the sharp bandpass filter being connected to the input of the linear stage; a limiter having an input and an output, the output of the linear stage being connected to the input of the limiter; and a feedback loop having an input and an output, the output of the limiter being connected to the input of the feedback loop and the output of the feedback loop being connected to the input of the sharp bandpass filter, wherein the improvement being comprised of the limiter being a symmetrical active clamp.

4 Claims, 4 Drawing Sheets

OSCILLATOR HAVING A LIMITER COMPOSED OF A SYMMETRIC ACTIVE CLAMP

FIELD OF THE INVENTION

The present invention lies in the field of precision oscillator circuits.

BACKGROUND OF THE INVENTION

The loop gain in an oscillator is determined by all of its elements. If a differential amplifier of the limiter of an oscillator has a reasonably well defined gain which it does if it is an operational amplifier with a large amount of feedback, and if you define that gain to be, for example, 2, and if the feedback network has a gain of slightly more than $\frac{1}{2}$ in a loop gain of 1.01, and if the loop gain is positive, oscillation will begin. For oscillation to begin a gain of at least 1 is required. However, many elements can vary. To compensate for various manufacturing tolerances extra gain is given, for example, 1.5; the oscillation will then start and it will start to grow because it will stay stable at a specific level only if the gain is exactly one. The oscillation will start to grow and something must happen to reduce that gain down from 1.5 to 1.0. After the gain is reduced to one, the oscillator will then maintain the level at 1. Usually the level of oscillation is maintained at 1 because the signal runs into the power supply of the oscillator. Therefore the power supply must be well defined and the clipping point of the amplitude of the signal must be symmetrical on both of the positive and negative sides. All oscillators start with a little extra gain. Preferably, an oscillator will start off with as little extra gain as possible. Therefore, it is necessary that the components of the oscillation circuit be controlled very well.

Another manner in which one can control the level of the signal is by means of a feedback circuit. A feedback circuit senses the amplitude of the signal of an oscillator with a precision rectifier and when the desired level of the signal is obtained the signal is sent back to a non-linear element which controls the gain of the amplifier. However, this feedback technique is slow because the non-linear element must not be non-linear to the oscillating frequency, it must only be non-linear in a dc sense which results in the feedback being slow, otherwise distortion would result.

Limiter circuits which limit the amplitude of alternating current in oscillators are well known. An example of a limiter circuit is shown in FIG. 1. In the limiter circuit shown in FIG. 1 a Zener diode is surrounded by a bridge rectifier. The circuit clips both sides of the signal reasonably well but it is dependent on the diode voltages. If the diodes were ideal, namely at a voltage of +0.0001 V they are on and at a voltage of −0.0001 V they are off and if the Zener diode had a tolerance of 0.0001% then the circuit would be fine, it would work great. However, in practice, Zener diodes have a tolerance of 1–5% at best and the temperature coefficient is undesirable. Resistance of resistor R in the circuit of FIG. 1 is much lower than the OFF resistance of diodes D1 through D4, so the signal is passed undistorted to the output when the diodes are OFF. Resistance of resistor R is much larger than the ON resistance of diodes D1 through D4 and of reference diode RD, so Voltage Vout=Vrd+Vd1+Vd3 for a positive signal and Vout=−Vrd−Vd2−Vd4 for a negative signal when the diodes are ON. The diode voltages Vrd+Vd1+Vd3, however, cannot be made precisely equal to Vrd+Vd2+Vd4 because no two components have identical characteristics. D1 through D4 could be matched discretely or they could be manufactured on the same silicon die to reduce variations in characteristics, but neither of these methods completely solve the problem.

A diode is by itself a rectifier but it is not ideal so as you go above zero it starts to turn on, but very slowly. To remedy this a diode is place in the feedback loop of an amplifier. The gain of the amplifier pushes the signal closer to zero thus making the circuit more ideal. That is the basis behind precision rectifiers.

A clamp is also a diode type circuit but there is a resister and a diode and the diode simply limits, because the diode is biased at a voltage other than zero volts. A classic method to reduce dependence on component variations is to put the components in the feedback loop of an operational amplifier. If this is done, the effect of the component variations is reduced in magnitude by the gain of the amplifier. Amplifier gains can be 100,000 thereby reducing the error caused by component variations to 1/100,000 namely to 0.001%. An example of an active clamp circuit of the prior art using the above-described technique is shown in FIG. 2. Such a circuit will pass the signal to the output undistorted whenever the signal voltage is below +Vref and will output a fixed voltage of +Vref whenever the signal voltage is greater than or equal to the clamp amplitude (+Vref). Clamping occurs precisely at +Vref regardless of variations in characteristics of diode D. However, clamping is one sided. Negative signal voltages are not clamped, rather, they pass undistorted for all amplitudes as is shown in the graph of FIG. 2b. Also the clamp has a problem in that the amplifier saturates when the diode system is off. Saturation of a differential amplifier occurs when the voltage of one input departs appreciably from the voltage of the other input resulting in the output voltage approaching the supply voltage. Saturation is detrimental to a system because when the input voltage departs appreciably from the voltage of the other input there is a large accumulation of charge inside the differential amplifier. Before the clamp can be turned back on the accumulated charge inside the differential amplifier must be discharged. In other words, a long recovery period to unsaturate the amplifier is required when the system is turned on again. This can be a problem in those circumstances which require immediate response of the system when the system is turned on.

SUMMARY OF THE INVENTION

Disclosed is an oscillator having an improved limiter. The improved limiter has means for preventing saturation of the limiter when the limiter is off. In the improved limiter a first diode is placed within the feedback loop of the amplifier such that the cathode of the first diode is proximal to the output terminal of the amplifier and the anode of the first diode is placed proximal to the negative input terminal of the differential amplifier. A second diode is placed within the circuit path connecting the output terminal of the amplifier to Vout such that the anode of the second diode is proximal to the output terminal of the op. amp and the cathode is proximal to Vout. In another emodiment the diodes are placed in the reverse order.

The present invention is an oscillator having a limiter comprised of an improved active clamp circuit which is a means for preventing saturation of the limiter when the limiter is off. The improved active clamp circuit has means for passing an input signal undistorted to the output when the input signal is below a certain amplitude referred to by the designation "clamp amplitude" for either positive or negative amplitudes. However, the passed input signal can possibly have a phase inversion or some defined gain or attenuation in amplitude. The improved active clamp circuit also has means for outputting a fixed amplitude equivalent to the clamp amplitude whenever the signal is greater than or equal to the clamp amplitude for either positive or negative amplitudes. The improved active clamp circuit can perform the above-described functions for both positive and negative amplitudes.

A preferred embodiment of the present invention is a symmetrical active clamp (SAC). The SAC circuit clamps both polarities of the input signal (called symmetrical clamping). The SAC circuit is comprised of two single polarity clamp circuits, one clamp circuit clamps positive polarity input signals and the other clamp circuit clamps the negative polarity input signal. The outputs of the positive and negative clamp circuits are summed together and preferably along with the input signal in a third amplifier, thus resulting in symmetrical active clamping.

BRIEF DESCRIPTION OF THE DRAWINGS

The invention is illustrated in the accompanying figures wherein like reference numbers represent like elements and in which.

DETAILED DESCRIPTION OF THE INVENTION

Figure 6:
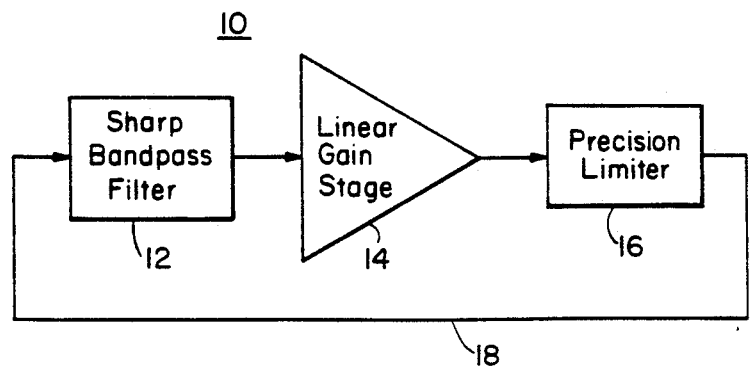
FIG. 6 is a schematic block diagram of a typical precision oscillator.

The present invention is an improved limiter for a precision oscillator. FIG. 6 is a block diagram showing a general scheme of a precision oscillator designated 10. Precision oscillator 10 is comprised of a sharp band pass filter 12 connected to a linear gain stage 14 which is connected to a precision limiter 16. The precision limiter is then connected to the sharp bandpass filter 12 via a feedback loop 18.

The improvement in the precision oscillator of the present invention lies in the precision limiter. The improved precision limiter is comprised of an improved active clamp 20 shown in FIG. 3. Improved active clamp 20 is comprised of a circuit path 22 connected to the input Voltage (Vin). Path 22 extends from Vin and connects to a resistor $R_1$ and extends and connects to the negative terminal of a differential amplifier 28. A positive reference Voltage (+Vref.) connects to the positive terminal of differential amplifier 28. A circuit path 24 connects to path 22 at a point between $R_1$ and differential amplifier 28. Circuit path 24 connects through a resistor $R_2$ to the Voltage output (Vout).

A circuit path 30 intersects circuit path 24 prior to the point at which path 24 connects to resistor $R_2$. Path 30 connects to the anode of a diode $D_1$, extends from the cathode of diode $D_1$ and intersects with a circuit path 32 which extends from the output of differential amplifier 28. Path 32 intersects with circuit path 30 and connects to the anode of a diode $D_2$. Path 32 extends from the cathode of $D_2$ and intersects with circuit path 24 at a point between resistor $R_2$ and Vout.

Figure 1A:
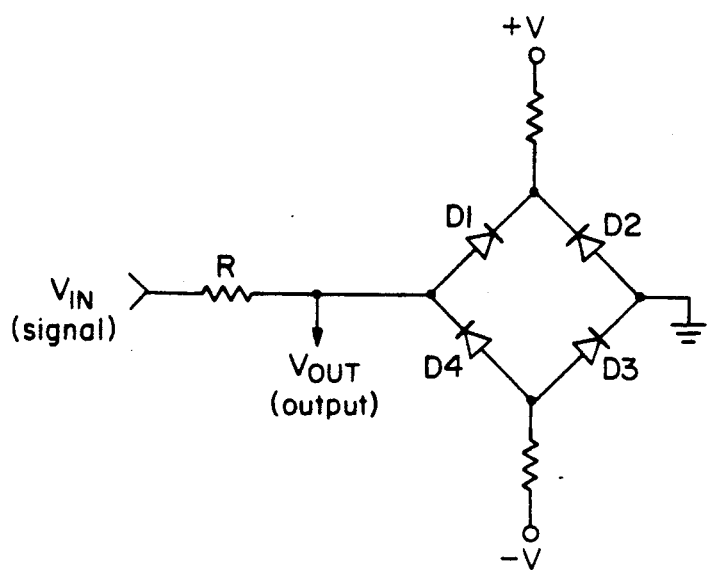
FIG. 1 is a circuit diagram of a clamping circuit of the prior art.
FIG. 1B is a graph showing how the alternating circuit of an oscillator is clamped by a clamping circuit of the prior art.
Figure 1B:
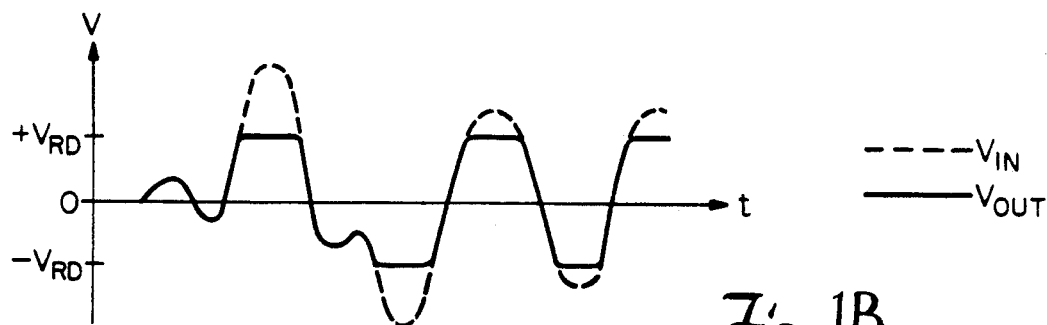
Figure 2A:
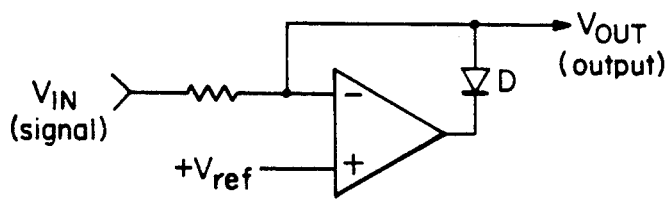
FIG. 2 is a circuit diagram of an active clamp of an oscillator of the prior art.
FIG. 2B is a graph showing how alternating current through an oscillator is clamped by the active clamp of FIG. 2.
Figure 2B:
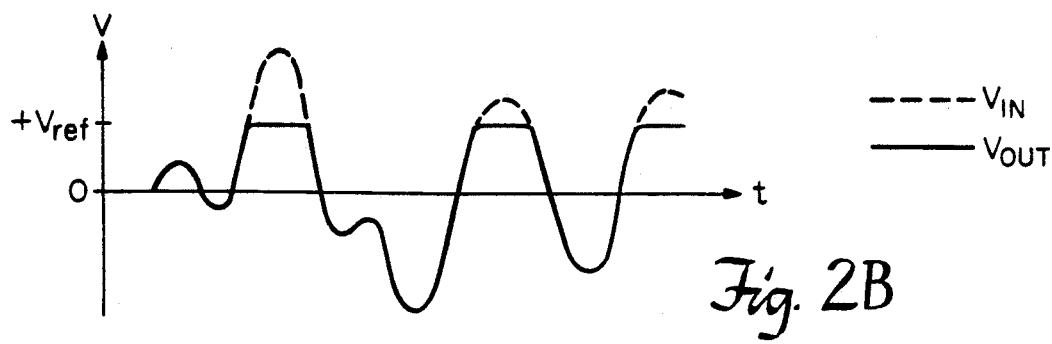
Figure 3A:
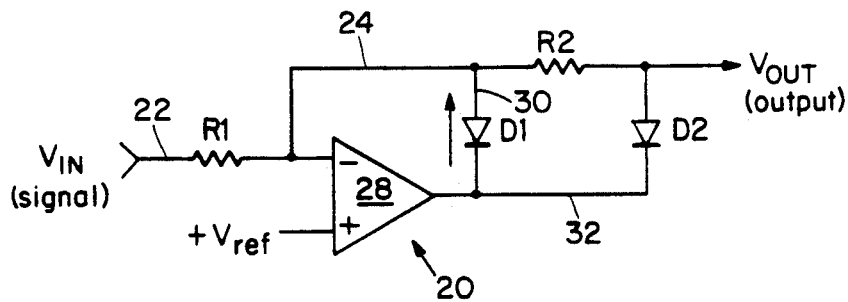
FIG. 3 is a circuit diagram of the improved active clamp circuit of a precision oscillator of the present invention.
FIG. 3B is a graph showing how alternating current through an oscillator is clamped by the improved active clamp of FIG. 3.
Figure 3B:
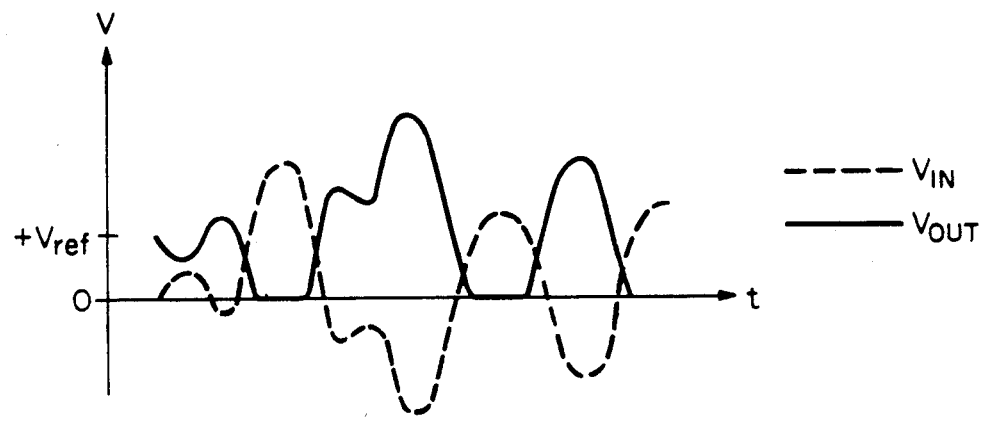

The difference between the active clamp of the prior art shown in FIG. 2 and the improved active clamp 20 in FIG. 3 of the present invention is the addition of another resistor $R_2$ and another diode $D_2$. The improved active clamp of the present invention is much faster because the amplifier does not saturate when diode $D_1$ is off. The negative input of the differential amplifier 28 is kept at +Vref potential by diode $D_2$ and resistor $R_2$ thus preventing saturation. A drawback of the improved active clamp of FIG. 3 is that it introduces an offset proportional to +Vref at the output which did not exist at the input.

Figure 4A:
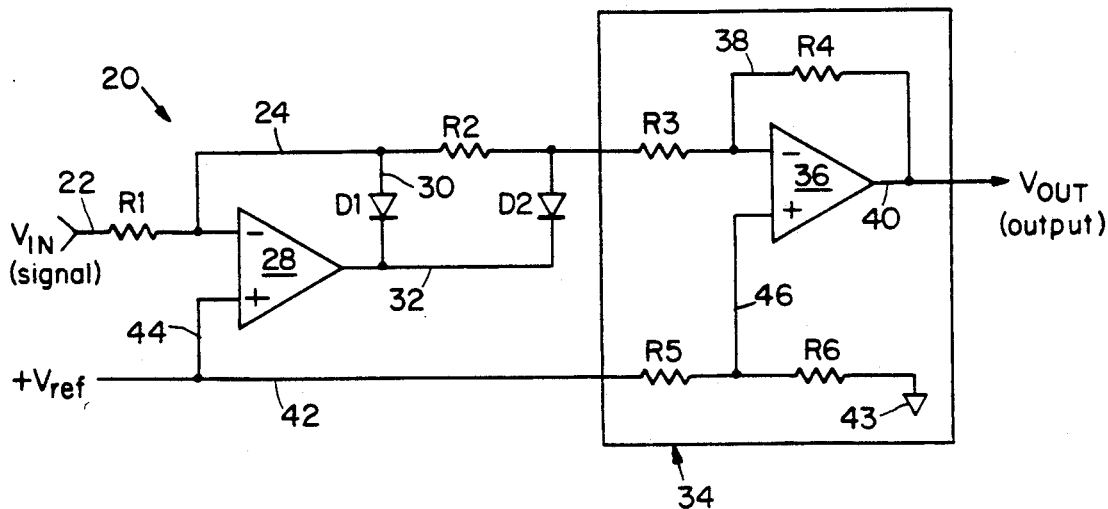
FIG. 4 is a circuit diagram of the improved active clamp of the present invention with level shift correction and polarity reversal correction.
FIG. 4B is a graph showing how alternating current through an oscillator is clamped by the improved active clamp of FIG. 4.
Figure 4B:
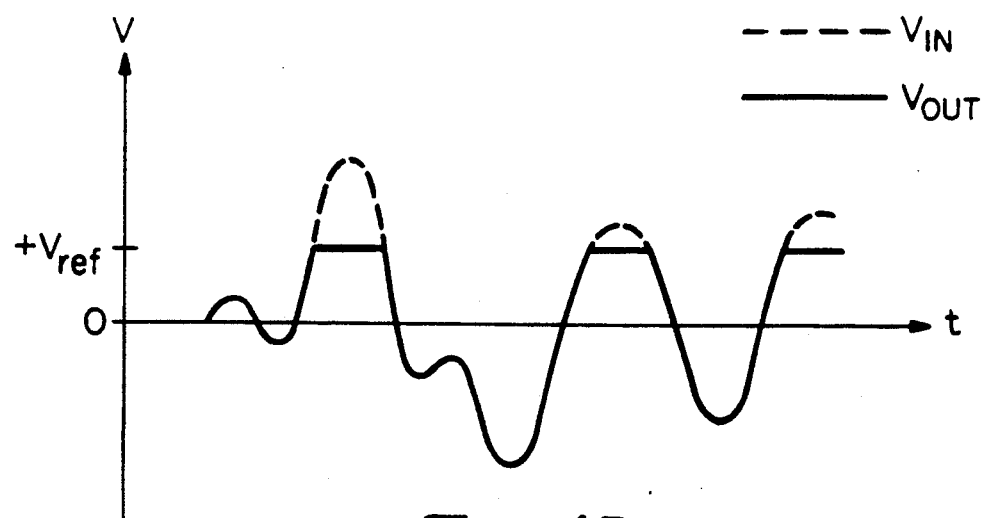

However, the above-described offset produced by the improved active clamp can be eliminated by a precision level shifting stage following the improved active clamp. FIG. 4 shows an improved active clamp 20 as shown in FIG. 3 with a precision level shifting stage 34. Instead of circuit path 24 extending to and connecting with Vout, circuit path 24 connects to a resistor $R_3$. From resistor $R_3$, circuit path 24 extends and connects to the negative terminal of a second differential amplifier 36. A circuit path 40 extends from the output of differential amplifier 36 to Vout. A circuit path 38 intersects with circuit path 24 at a point between $R_3$ and differential amplifier 36. Circuit path 38 connects to a resistor $R_4$ and extends from $R_4$ and intersects with circuit path 40.

A circuit path 42 connects to and extends from +Vref, connects through a resistor $R_5$, through a resistor $R_6$ and to the ground 43. A circuit path 44 extends from the positive terminal of differential amplifier 28 and intersects with circuit path 42 in between +Vref and resistor $R_5$. A circuit path 46 extends from the positive terminal of differential amplifier 36 and intersects circuit path 42 in between resistor $R_5$ and resistor $R_6$.

Figure 5A:
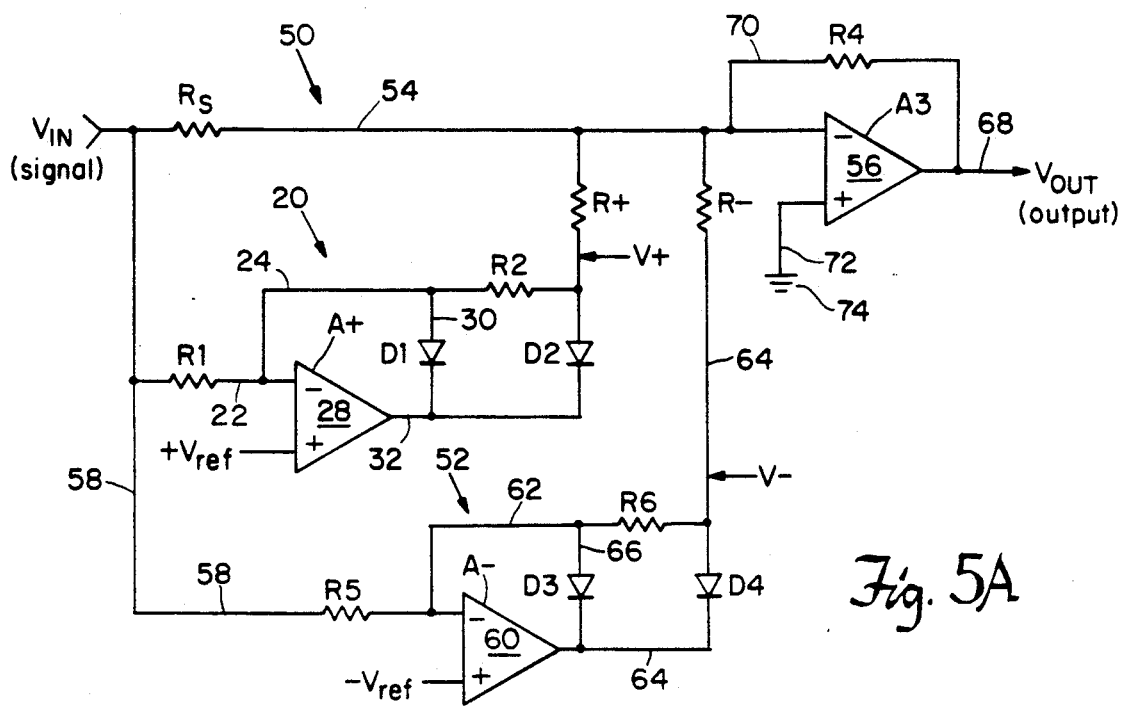
FIG. 5 is a circuit diagram showing an embodiment of the Symmetrical Active Clamp of the present invention.
FIG. 5B is a graph showing how alternating current through an oscillator is clamped by the symmetrical active clamp of FIG. 5.
Figure 5B:
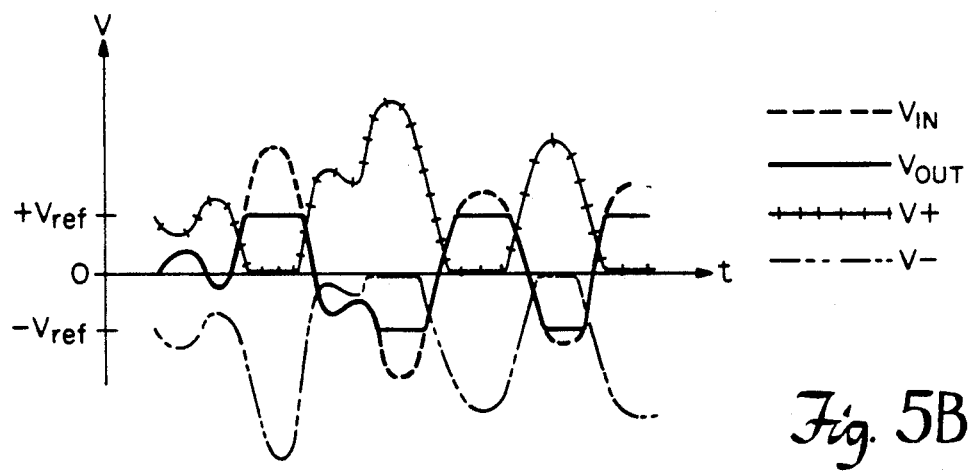

The preferred embodiment of the present invention is a symmetrically active clamp (SAC) designated 50 in FIG. 5. Symmetrically Active Clamp 50 is comprised of two single polarity improved active clamp circuits 20 and 52. Active clamp 20 clamps positive polarity input signals and active clamp 52 clamps the negative polarity input signal.

Vin in FIG. 5 connects to circuit path 54 which extends and is connected to resistor Rs. Path 54 then extends from resistor Rs and is connected to the negative terminal of differential amplifier 56. A circuit path 58 extends from and connects to circuit path 54 at a point between Vin and resistor Rs. Connected to circuit path 58 is positive active clamp 20 by means of circuit path 22. Active Clamp 20 is identical to the improved active clamp 20 described above and shown in FIGS. 3 and 4. However, circuit path 32 extends through and connects to a resistor R+ and intersects with circuit path 54. Moreover, path 24 does not extend to a precision level shifting stage. Path 24 intersects with circuit path 32 between R+ and $D_2$.

Circuit branch 58 extends past the intersection with path 22 and connects to a resistor $R_5$ of improved active clamp 52. Path 58 extends from resistor $R_5$ and connects to and terminates at the negative terminal of an differential amplifier 60. The positive terminal of differential amplifier 60 is connected to a −Vref instead of a +Vref as is the case with differential amplifier 28 of active clamp 20. From the output terminal of differential amplifier 60 extends path 64 and connects to the cathode of a diode $D_4$. Path 64 extends from the anode of $D_4$, connects to resistor R− and intersects with path 54.

A circuit path 62 intersects with path 58 at a point between resistor $R_5$ and the negative terminal of differential amplifier 60. Path 62 connects to a resistor $R_6$ and extends from resistor $R_6$ and intersects with path 64 in between the anode of $D_4$ and R−. A circuit path 66 extends from path 64 at a point between the output of amplifier 60 and the cathode of $D_4$. From path 64, path 66 extends and connects to the anode of a diode $D_3$, extends from the cathode of $D_3$ and intersects and connects to path 62 at a point between the point at which path 62 connects to path 58 and resistor $R_6$. The diodes $D_1$ and $D_2$ in active clamp 20 are pointed in the opposite direction from that of diodes $D_3$ and $D_4$ of active clamp 52.

A circuit path 68 extends from the output of differential amplifier 56 to Vout. Path 70 connects to path 54 between the point at which path 64 intersects with path 54 and differential amplifier 56. Path 70 extends from path 54 and connects to a resistor $R_4$, extends from resistor $R_4$ and intersects with path 68. Path 72 extends from the positive terminal of differential amplifier 56 to a ground 74.

As was stated above, a Symmetrical Active Clamp circuit clamps both polarities of the input signal which is the definition of symmetrical clamping. The output of the two improved active clamp circuits are summed together via R+ and R− along with the input signal via Rs in the third differential amplifier 56, thus resulting in symmetrical clamping.

While the above-described preferred embodiment of the symmetrical active clamp utilizes two improved active clamps as shown in FIG. 3, it should be recognized that clamps of the prior art as those shown in FIG. 2 and described in the background of the invention can be substituted for the positive clamp 20 and the negative clamp 52 when saturation of the differential amplifier is not an important issue in a specific application of an oscillator.

Without the presence of resistor Rs, clamping would not be complete because while the positive active clamp 20 clamps the input signal when the input signal is above +Vref, negative active clamp 52 does not, so the input signal would still be passed to the output via negative active clamp 52. Likewise, while negative active clamp 52 clamps the input signal when the input signal is below −Vref, positive active clamp 20 does not resulting in the input signal still being passed to the output via positive active clamp 20. Rs eliminates both of the above passed signals by summing in an appropriate amount of the input signal which is of opposite polarity to the passed signals.

A precision oscillator as is illustrated in FIG. 6 requires a precision limiter because the limiter determines the oscillating amplitude of the oscillator. A noise voltage generated somewhere in the loop is amplified by linear gain stage 14 and filtered by sharp bandpass filter 12. The loss produced by filter 12 is less than the gain produced by linear gain stage 14 for noise voltages in the frequency band of the bandpass filter 12. Therefore, each time the noise voltage goes around the loop, it grows in amplitude until the precision limiter 16 limits the amplified noise voltage such that "the amplitude of the input to the limiter minus the amplitude of the fundamental component of the output from the limiter" (referred hereinafter as "amount of limiting") exactly equals the gain of linear gain stage 14 minus the loss of filter 12. At such a level, the gain around the loop is exactly unity and the amplified noise voltage grows no more.

The amplitude of the amplified noise voltage at any predetermined point in the oscillator loop (referred to by the term "amplitude of the oscillator") is critically dependent on:

(1) the loss and sharpness of filter 12,
(2) the gain of linear gain stage 14, and
(3) the fundamental component of the limiter output in relation to the harmonic components of the limiter output.

Filter 12 and linear gain stage 14 are linear circuits, therefore, the loss of filter 12 and the gain of linear gain stage 14 can be controlled precisely for the fundamental component of the limiter output but much less precisely for the harmonic components of the limiter output. More importantly, the balance between the fundamental component and harmonic components of the limiter output is dependent on the amount of limiting and the precision of limiting. The amplitude of the oscillator will be much less dependent on (1) and (2) if the amount of limiting is kept to a minimum and if symmetrical limiting is used. Symmetrical limiting results in no even harmonic components so the second harmonic is absent. The third harmonic being further removed from the fundamental, the third harmonic is greater attenuated by the bandpass filter 12.

While this invention has been described with respect to certain embodiments, it is not so limited, and it should be understood that variations and modifications thereof may be made which are obvious to those skilled in the art without departing from the spirit or scope of the invention.

I claim:

1. An oscillator circuit comprised of a sharp bandpass filter having an input and an output; a linear gain stage having an input and an output, the output of the sharp bandpass filter being connected to the input of the linear stage; a limiter having an input and an output, the output of the linear stage being connected to the input of the limiter; and a feedback loop having an input and an output, the output of the limiter being connected to the input of the feedback loop and the output of the feedback loop being connected to the input of the sharp bandpass filter, wherein the improvement being comprised of:

the limiter being comprised of a symmetrical active clamp.

2. An oscillator circuit as recited in claim 1, wherein the limiter has means for clamping a positive input signal producing a clamped positive output signal;

means for clamping a negative input signal producing a clamped negative output signal; and means for summing the clamped positive output signal of the limiter with the clamped negative output signal of the limiter.

3. An oscillator circuit as recited in claim 2, wherein the symmetrical active clamp is comprised of:

a positive polarity clamp comprised of a positive differential amplifier having a negative input terminal connected to receive an input signal Vin, a positive input terminal connected to a positive reference voltage, an output terminal connected to produce said clamped positive output signal, and a feedback loop connecting the output terminal of the positive differential amplifier to the negative input terminal of the positive differential amplifier such that the positive polarity clamp clamps positive polarity input signals;

a negative polarity clamp comprised of a negative differential amplifier having a negative input terminal connected to Vin, a positive input terminal connected to a negative reference voltage, an output terminal connected to produce said clamped negative output signal and a feedback loop connecting the output terminal of the negative differential amplifier to the negative input terminal of the negative differential amplifier such that the negative polarity clamp clamps negative input signals; and a third amplifier having an input terminal and an output terminal, wherein the input terminal of the third amplifier is connected to both the output terminal of the positive polarity clamp and to the output terminal of the negative polarity clamp such that the output of the positive polarity clamp and the output of the negative polarity clamp are summed together.

4. A symmetrical active clamp as recited in claim 3, wherein Vin is connected to the input terminal of the third amplifier.

* * * * *